(12) United States Patent
Trezza

(10) Patent No.: US 7,670,874 B2
(45) Date of Patent: Mar. 2, 2010

(54) PLATED PILLAR PACKAGE FORMATION

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 228 days.

(21) Appl. No.: 11/675,731

(22) Filed: Feb. 16, 2007

(65) Prior Publication Data

US 2008/0197508 A1    Aug. 21, 2008

(51) Int. Cl.
*H01L 21/00* (2006.01)
(52) U.S. Cl. .................. 438/106; 438/39; 438/618; 438/675; 257/E21.575; 257/E21.577; 257/E21.589
(58) Field of Classification Search .................. 438/41, 438/42, 44, 55, 642
See application file for complete search history.

(56) References Cited

U.S. PATENT DOCUMENTS

| | | | |
|---|---|---|---|
| 3,312,878 A | 4/1967 | Poch et al. | |
| 3,591,839 A | 7/1971 | Evans | |
| 3,720,309 A | 3/1973 | Weir | |
| 4,200,272 A | 4/1980 | Godding | |
| 4,452,557 A | 6/1984 | Bouwknegt et al. | |
| 4,873,205 A | 10/1989 | Critchlow et al. | |
| 4,878,611 A | 11/1989 | LoVasco et al. | |
| 4,893,174 A | 1/1990 | Yamada et al. | |
| 4,915,494 A | 4/1990 | Shipley et al. | |
| 4,967,248 A | 10/1990 | Shimizu | |
| 4,999,077 A | 3/1991 | Drake et al. | |
| 5,089,055 A | 2/1992 | Nakamura | |
| 5,089,880 A | 2/1992 | Meyer et al. | |
| 5,090,119 A | 2/1992 | Tsuda et al. | |
| 5,100,480 A | 3/1992 | Hayafuji et al. | |
| 5,120,597 A | 6/1992 | Takimoto et al. | |
| 5,179,043 A | 1/1993 | Weichold et al. | |
| 5,220,530 A | 6/1993 | Itoh | |
| 5,229,315 A | 7/1993 | Jun et al. | |
| 5,234,149 A | 8/1993 | Katz | |
| 5,236,854 A | 8/1993 | Higaki | |
| 5,308,784 A | 5/1994 | Kim et al. | |
| 5,399,898 A | 3/1995 | Rostoker | |
| 5,427,834 A | 6/1995 | Sodetz | |
| 5,468,655 A | 11/1995 | Greer | |
| 5,470,787 A | 11/1995 | Greer | |
| 5,510,655 A | 4/1996 | Tanielian | |
| 5,523,628 A | 6/1996 | Williams et al. | |
| 5,561,594 A | 10/1996 | Wakefield | |
| 5,563,084 A | 10/1996 | Ramm et al. | |
| 5,587,119 A | 12/1996 | White | |

(Continued)

FOREIGN PATENT DOCUMENTS

EP    0 516 866    12/1992

(Continued)

OTHER PUBLICATIONS

International Search Report for PCT/US06/23364, dated Nov. 13, 2006.

(Continued)

*Primary Examiner*—Savitri Mulpuri
*Assistant Examiner*—Cheung Lee

(57) ABSTRACT

A method involves plating pillars of electrically conductive material up from a seed layer located on a substrate, surrounding the pillars with a fill material so that the pillars and fill material collectively define a first package, and removing the substrate from the first package.

24 Claims, 6 Drawing Sheets

U.S. PATENT DOCUMENTS

| | | | |
|---|---|---|---|
| 5,589,029 A | 12/1996 | Matsui et al. |
| 5,598,965 A | 2/1997 | Scheu |
| 5,608,264 A | 3/1997 | Gaul |
| 5,635,014 A | 6/1997 | Taylor |
| 5,708,569 A | 1/1998 | Howard et al. |
| 5,780,776 A | 7/1998 | Noda |
| 5,796,591 A | 8/1998 | Dalal et al. |
| 5,814,889 A | 9/1998 | Gaul |
| 5,846,464 A | 12/1998 | Hoffman |
| 5,872,338 A | 2/1999 | Lan et al. |
| 5,929,524 A | 7/1999 | Drynan et al. |
| 5,962,922 A | 10/1999 | Wang |
| 5,963,793 A | 10/1999 | Rinne et al. |
| 5,973,396 A | 10/1999 | Farnworth |
| 6,030,894 A | 2/2000 | Hada et al. |
| 6,037,665 A | 3/2000 | Miyazaki |
| 6,075,710 A | 6/2000 | Lau |
| 6,087,719 A | 7/2000 | Tsunashima |
| 6,118,181 A | 9/2000 | Merchant et al. |
| 6,135,635 A | 10/2000 | Miller et al. |
| 6,184,066 B1 | 2/2001 | Chino et al. |
| 6,188,118 B1 | 2/2001 | Severn |
| 6,207,475 B1 | 3/2001 | Lin et al. |
| 6,215,114 B1 | 4/2001 | Yagi et al. |
| 6,232,668 B1 | 5/2001 | Hikita et al. |
| 6,277,711 B1 | 8/2001 | Wu |
| 6,283,693 B1 | 9/2001 | Acello et al. |
| 6,297,072 B1 | 10/2001 | Tilmans et al. |
| 6,314,013 B1 | 11/2001 | Ahn et al. |
| 6,316,737 B1 | 11/2001 | Evans et al. |
| 6,316,786 B1 | 11/2001 | Mueller et al. |
| 6,326,115 B1 | 12/2001 | Nakanishi et al. |
| 6,335,571 B1 | 1/2002 | Capote et al. |
| 6,393,638 B1 | 5/2002 | Maccoll |
| 6,395,630 B2 | 5/2002 | Ahn et al. |
| 6,395,633 B1 * | 5/2002 | Cheng et al. ............ 438/687 |
| 6,399,426 B1 | 6/2002 | Capote |
| 6,410,415 B1 | 6/2002 | Estes |
| 6,410,431 B2 | 6/2002 | Bertin et al. |
| 6,429,045 B1 | 8/2002 | Furukawa et al. |
| 6,451,626 B1 | 9/2002 | Lin |
| 6,484,776 B1 | 11/2002 | Meilunas et al. |
| 6,498,089 B2 | 12/2002 | Komada |
| 6,498,503 B2 | 12/2002 | Akram et al. |
| 6,501,185 B1 | 12/2002 | Chow et al. |
| 6,503,779 B2 | 1/2003 | Miyazaki |
| 6,509,256 B2 | 1/2003 | Medlen et al. |
| 6,513,236 B2 | 2/2003 | Tsukamoto |
| 6,531,022 B1 | 3/2003 | Tsukahara |
| 6,544,371 B2 | 4/2003 | Senoo et al. |
| 6,551,858 B2 | 4/2003 | Kawata et al. |
| 6,555,418 B2 | 4/2003 | Kurosawa et al. |
| 6,557,192 B2 | 5/2003 | Zheng |
| 6,559,540 B2 | 5/2003 | Kawashima |
| 6,576,830 B2 | 6/2003 | Nagao et al. |
| 6,577,013 B1 | 6/2003 | Glenn et al. |
| 6,586,090 B2 | 7/2003 | Nakagawa et al. |
| 6,590,278 B1 | 7/2003 | Behun et al. |
| 6,596,640 B1 | 7/2003 | Fishcer et al. |
| 6,599,778 B2 | 7/2003 | Pogge et al. |
| 6,611,057 B2 | 8/2003 | Mikubo et al. |
| 6,617,507 B2 | 9/2003 | Mapes et al. |
| 6,617,688 B2 | 9/2003 | Ikegami et al. |
| 6,627,477 B1 | 9/2003 | Hakey et al. |
| 6,633,079 B2 | 10/2003 | Cheever et al. |
| 6,635,960 B2 | 10/2003 | Farrar et al. |
| 6,635,970 B2 | 10/2003 | Lasky et al. |
| 6,674,647 B2 | 1/2004 | Pierson et al. |
| 6,680,540 B2 | 1/2004 | Nakano |
| 6,686,654 B2 | 2/2004 | Farrar et al. |
| 6,689,627 B2 | 2/2004 | Mottura et al. |
| 6,689,949 B2 | 2/2004 | Ortabasi |
| 6,703,555 B2 | 3/2004 | Takabayashi et al. |
| 6,704,953 B2 | 3/2004 | Fishman |
| 6,706,554 B2 | 3/2004 | Ogura |
| 6,717,045 B2 | 4/2004 | Chen |
| 6,717,071 B2 | 4/2004 | Chang et al. |
| 6,720,245 B2 | 4/2004 | Stucchi et al. |
| 6,727,582 B2 | 4/2004 | Shibata |
| 6,730,840 B2 | 5/2004 | Sasaoka et al. |
| 6,733,685 B2 | 5/2004 | Beilin et al. |
| 6,740,576 B1 | 5/2004 | Lin et al. |
| 6,756,594 B2 | 6/2004 | George et al. |
| 6,756,680 B2 | 6/2004 | Jimarez et al. |
| 6,765,287 B1 | 7/2004 | Lin |
| 6,768,210 B2 | 7/2004 | Zuniga-Ortiz et al. |
| 6,770,509 B2 | 8/2004 | Halope et al. |
| 6,770,555 B2 | 8/2004 | Yamazaki |
| 6,770,822 B2 | 8/2004 | Pasternak et al. |
| 6,780,280 B2 | 8/2004 | Halterbeck et al. |
| 6,790,663 B2 | 9/2004 | Kerr et al. |
| 6,798,030 B1 | 9/2004 | Izumi et al. |
| 6,818,818 B2 | 11/2004 | Bareis |
| 6,824,643 B2 | 11/2004 | Yoshimoto et al. |
| 6,838,362 B2 | 1/2005 | Mastromatteo et al. |
| 6,841,883 B1 | 1/2005 | Farnworth et al. |
| 6,844,259 B2 | 1/2005 | Cheong |
| 6,846,725 B2 | 1/2005 | Nagarajan et al. |
| 6,869,856 B2 | 3/2005 | Combi et al. |
| 6,872,635 B2 | 3/2005 | Hayashi et al. |
| 6,881,609 B2 | 4/2005 | Salmon |
| 6,889,427 B2 | 5/2005 | Yee et al. |
| 6,903,443 B2 | 6/2005 | Farnworth et al. |
| 6,909,180 B2 | 6/2005 | Ono et al. |
| 6,919,642 B2 | 7/2005 | Hsieh et al. |
| 6,920,051 B2 | 7/2005 | Figueroa et al. |
| 6,929,974 B2 | 8/2005 | Ding et al. |
| 6,938,783 B2 | 9/2005 | Chung |
| 6,939,789 B2 | 9/2005 | Huang et al. |
| 6,967,307 B2 | 11/2005 | Hembree et al. |
| 6,975,027 B2 | 12/2005 | Farrar et al. |
| 6,986,377 B2 | 1/2006 | Johnson et al. |
| 6,992,824 B1 | 1/2006 | Motamedi et al. |
| 6,995,469 B2 | 2/2006 | Hatakeyama |
| 7,013,509 B2 | 3/2006 | Hickman |
| 7,015,590 B2 | 3/2006 | Jeong et al. |
| 7,023,347 B2 | 4/2006 | Arneson et al. |
| 7,033,859 B2 | 4/2006 | Pendse |
| 7,052,941 B2 | 5/2006 | Lee |
| 7,053,456 B2 | 5/2006 | Matsuo |
| 7,056,813 B2 | 6/2006 | Morrow et al. |
| 7,061,104 B2 | 6/2006 | Kenny et al. |
| 7,107,666 B2 | 9/2006 | Hiatt et al. |
| 7,115,505 B2 | 10/2006 | Hartwell |
| 7,115,984 B2 | 10/2006 | Poo et al. |
| 7,135,777 B2 | 11/2006 | Bakir et al. |
| 7,138,706 B2 | 11/2006 | Arai et al. |
| 7,141,869 B2 | 11/2006 | Kim et al. |
| 7,144,759 B1 | 12/2006 | Hilton et al. |
| 7,145,236 B2 | 12/2006 | Miura et al. |
| 7,157,310 B2 | 1/2007 | Benson et al. |
| 7,157,372 B1 | 1/2007 | Trezza |
| 7,170,183 B1 | 1/2007 | Kim et al. |
| 7,193,308 B2 | 3/2007 | Matsui |
| 7,218,349 B2 | 5/2007 | Kimura |
| 7,227,213 B2 | 6/2007 | Mastromatteo et al. |
| 7,230,318 B2 | 6/2007 | Kripesh et al. |
| 7,233,028 B2 | 6/2007 | Weeks et al. |
| 7,242,099 B2 | 7/2007 | Lin et al. |
| 7,249,992 B2 | 7/2007 | Kalenian et al. |
| 7,253,519 B2 | 8/2007 | Huang et al. |
| 7,262,082 B1 | 8/2007 | Lin et al. |
| 7,264,984 B2 * | 9/2007 | Garabedian et al. ......... 438/48 |
| 7,271,491 B1 | 9/2007 | Akram |

| | | |
|---|---|---|
| 7,276,787 B2 | 10/2007 | Edelstein et al. |
| 7,294,531 B2 | 11/2007 | Hwang et al. |
| 7,300,865 B2 | 11/2007 | Hsieh et al. |
| 7,303,976 B2 | 12/2007 | Sand |
| 7,326,629 B2 | 2/2008 | Nagarajan et al. |
| 7,371,676 B2 | 5/2008 | Hembree |
| 7,384,863 B2 | 6/2008 | Shibata |
| 7,390,735 B2 | 6/2008 | Mehrotra |
| 7,399,652 B2 | 7/2008 | Sassolini et al. |
| 7,456,089 B2 | 11/2008 | Aiba et al. |
| 7,456,497 B2 | 11/2008 | Higashi |
| 7,479,659 B2 | 1/2009 | Cognetti et al. |
| 7,488,680 B2 | 2/2009 | Andry et al. |
| 7,495,316 B2 | 2/2009 | Kirby et al. |
| 7,534,722 B2 | 5/2009 | Trezza |
| 2001/0001292 A1 | 5/2001 | Bertin et al. |
| 2001/0033509 A1 | 10/2001 | Ahn et al. |
| 2001/0042734 A1* | 11/2001 | Beilin et al. ............. 216/38 |
| 2001/0048166 A1 | 12/2001 | Miyazaki |
| 2002/0004299 A1 | 1/2002 | Schuele et al. |
| 2002/0053726 A1 | 5/2002 | Mikubo et al. |
| 2002/0104873 A1 | 8/2002 | Lee et al. |
| 2003/0047799 A1 | 3/2003 | Cheever et al. |
| 2003/0085471 A1 | 5/2003 | Iijima et al. |
| 2003/0145939 A1 | 8/2003 | Ahn et al. |
| 2003/0214036 A1 | 11/2003 | Sarihan et al. |
| 2003/0216030 A1 | 11/2003 | Kim et al. |
| 2003/0222354 A1 | 12/2003 | Mastromatteo et al. |
| 2004/0029304 A1 | 2/2004 | Naydenkov et al. |
| 2004/0104791 A1 | 6/2004 | Satoh et al. |
| 2004/0177774 A1 | 9/2004 | Naitoh et al. |
| 2004/0192029 A1 | 9/2004 | Hartwell |
| 2004/0199998 A1 | 10/2004 | Shinner |
| 2004/0207061 A1 | 10/2004 | Farrar et al. |
| 2004/0238115 A1 | 12/2004 | Matsuno et al. |
| 2004/0262635 A1 | 12/2004 | Lee |
| 2005/0042838 A1 | 2/2005 | Garyainov et al. |
| 2005/0046034 A1 | 3/2005 | Farrar |
| 2005/0048766 A1 | 3/2005 | Wu et al. |
| 2005/0104027 A1 | 5/2005 | Lazarev |
| 2005/0104219 A1 | 5/2005 | Matsui |
| 2005/0121768 A1 | 6/2005 | Edelstein et al. |
| 2005/0146049 A1 | 7/2005 | Kripesh et al. |
| 2005/0163982 A1 | 7/2005 | Ono et al. |
| 2005/0167830 A1* | 8/2005 | Chang et al. ............. 257/737 |
| 2005/0184377 A1 | 8/2005 | Takeuchi et al. |
| 2005/0230804 A1 | 10/2005 | Tanida et al. |
| 2005/0233504 A1 | 10/2005 | Doi et al. |
| 2005/0245059 A1* | 11/2005 | Yuan et al. ............. 438/612 |
| 2005/0262634 A1 | 12/2005 | Gottlieb |
| 2005/0263869 A1 | 12/2005 | Tanaka et al. |
| 2005/0266670 A1 | 12/2005 | Lin et al. |
| 2006/0001174 A1 | 1/2006 | Matsui |
| 2006/0070704 A1 | 4/2006 | Sinclair et al. |
| 2006/0073701 A1* | 4/2006 | Koizumi et al. ............. 438/666 |
| 2006/0125084 A1 | 6/2006 | Fazzio et al. |
| 2006/0128061 A1 | 6/2006 | Ravi et al. |
| 2006/0170089 A1 | 8/2006 | Mizukoshi |
| 2006/0208326 A1 | 9/2006 | Nasiri et al. |
| 2006/0223301 A1 | 10/2006 | Vanhaelemeersch |
| 2006/0252262 A1 | 11/2006 | Kazemi |
| 2006/0264029 A1 | 11/2006 | Heck et al. |
| 2006/0275946 A1 | 12/2006 | MacNamara et al. |
| 2006/0278988 A1 | 12/2006 | Trezza |
| 2006/0278992 A1 | 12/2006 | Trezza et al. |
| 2006/0281303 A1 | 12/2006 | Trezza et al. |
| 2006/0281363 A1 | 12/2006 | Trezza |
| 2006/0289990 A1 | 12/2006 | Farrar |
| 2006/0292824 A1 | 12/2006 | Beyne et al. |
| 2007/0020926 A1 | 1/2007 | Kalvesten et al. |
| 2007/0096263 A1 | 5/2007 | Furukawa et al. |
| 2007/0184653 A1 | 8/2007 | Blanchard |
| 2007/0228576 A1 | 10/2007 | Trezza |
| 2007/0278641 A1 | 12/2007 | Trezza |
| 2008/0003817 A1 | 1/2008 | Morimoto |
| 2008/0111582 A1 | 5/2008 | Matsui et al. |
| 2008/0116567 A1 | 5/2008 | Amin et al. |
| 2008/0213941 A1 | 9/2008 | Pendse |
| 2008/0254618 A1 | 10/2008 | Umemoto et al. |
| 2008/0284037 A1 | 11/2008 | Andry et al. |

FOREIGN PATENT DOCUMENTS

| | | |
|---|---|---|
| EP | 0 620 701 | 10/1994 |
| EP | 0 757 386 | 2/1997 |
| EP | 1 415 950 | 5/2004 |
| EP | 1 643 819 | 4/2006 |
| JP | 2001-129800 | 5/2001 |
| JP | 2004-214423 | 7/2004 |
| JP | 2004-273596 | 9/2004 |
| WO | WO 2004/084300 | 9/2004 |

OTHER PUBLICATIONS

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.
International Search Report, PCT/US06/23361, dated Sep. 19, 2007.
The International Search Report and Written Opinion for PCT/US2008/053994 mailed on May 26, 2008.
"Fiber Optics Tutorial—Termination Website", http://www.lanshack.com/fiber-optic-tutorial-termination.asp accessed on Aug. 1, 2003, Available from www.archive.org, 7 pages.
International Search Report and Written Opinion for PCT/IB2008/001429, mailed Apr. 3, 2009.
International Search Report and Written Opinion for PCT/US2006/23249, mailed Jun. 19, 2007.
International Search Report and Written Opinion for PCT/US2006/23366, mailed Dec. 8, 2006.
International Search Report and Written Opinion for PCT/US2006/23361, mailed Sep. 19, 2007.
International Search Report and Written Opinion for PCT/US2006/23365, mailed Jan. 19, 2007.
International Search Report and Written Opinion for PCT/US2006/23364, mailed Dec. 28, 2008.
International Search Report and Written Opinion for PCT/US2006/23297, mailed Jan. 3, 2007.
International Search Report and Written Opinion for PCT/US2006/23362, mailed May 20, 2008.
International Search Report and Written Opinion for PCT/US2006/23250, mailed May 19, 2008.
International Search Report and Written Opinion for PCT/US2008/53994, mailed May 26, 2008.
International Search Report and Written Opinion for PCT/US2007/089061, mailed Jun. 26, 2008.
International Search Report and Written Opinion for PCT/US2006/23367, mailed Jun. 10, 2008.
International Search Report and Written Opinion for PCT/US2006/023246, mailed Jul. 3, 2008.
International Search Report and Written Opinion for PCT/US2006/023248, mailed Jul. 3, 2008.
International Search Report and Written Opinion for PCT/US2006/023363, mailed Jul. 2, 2008.
International Search Report and Written Opinion for PCT/US2006/023368, mailed Jul. 11, 2008.
International Search Report and Written Opinion for PCT/US2008/064136, mailed Sep. 26, 2008.
International Search Report issued in PCT/US2006/023174 mailed Jul. 17, 2008.
Harper, Charles A., "Electronic Packaging and Interconnection Handbook"; 2000; McGraw-Hill, Third Edition; p. 6.1.
Merriam-Webster Online website, <http://www.meriam-webster.com/dictionary/bounding> printed on Apr. 10, 2009.
International Preliminary Report on Patentability for PCT/US2006/023368 issued Mar. 31, 2009.

International Preliminary Report on Patentability for PCT/US2006/023363 issued Mar. 31, 2009.

International Preliminary Report on Patentability for PCT/US2006/023367 issued Mar. 31, 2009.

International Preliminary Report on Patentability for PCT/US2006/023246 issued May 5, 2009.

Topol, A. W. et al, "Enabling Technologies for Wafer-Level Bonding of 3D MEMS and Integrated Circuit Structures", Electronic Components and Technology Conference, 2004, vol. 1, Jun. 1-4, 2004, pp. 931-938.

Office Action issued in Chinese Patent Application No. 2006800293133 dated Jul. 3, 2009.

International Preliminary Report on Patentability for PCT/US2007/089061 mailed Jul. 9, 2009.

*Ex Parte Quayle* issued for U.S. Appl. No. 11/688,088 mailed on Jul. 30, 2009.

International Preliminary Report on Patentability for PCT/US2008/053994 issued on Aug. 19, 2009.

International Preliminary Report on Patentability for PCT/US2006/023362 issued May 12, 2009.

Merriam-Webster Online website, <http://www.merriam-webster.com/dictionary/bounding> printed on Apr. 10, 2009.

International Preliminary Report on Patentability for PCT/US2008/064136 mailed on Oct. 1, 2009.

International Preliminary Report on Patentability for PCT/US2008/064136 mailed on Oct. 1, 2009.

International Preliminary Report on Patentability for PCT/US2008/001429 mailed on Oct. 15, 2009.

* cited by examiner

PLATED PILLAR PACKAGE FORMATION

FIELD OF THE INVENTION

The present invention relates to electrical connections and, more particularly, to a process of forming a package for such electrical connections.

BACKGROUND

U.S. patent application Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, incorporated herein by reference, describe various techniques for forming small, deep vias in, and electrical contacts for, semiconductor wafers. Our techniques allow for via densities and placement that was previously unachievable and can be performed on a chip, die or wafer scale. However, if these techniques are used to form high density interconnects, there is presently no "off the shelf" or low cost commercially available packaging that can be used with them.

There is therefore a present need for low cost packaging that can be used with such high density interconnects.

SUMMARY OF THE INVENTION

We have devised a way to create a low cost package that can be used with a chip or a die containing densely packed small vias, such as described in the above-incorporated applications. Our approach allows for low cost, accurate formation of the package connections on extremely small pitches, on the order of 25 μm or less and, in many cases 10 μm or less. Moreover, the same approach can be applied with different materials to allow the package to be tailored to the particular application in terms of, for example, thermal expansion, strength, flexure/rigidity, or to be tailored to a particular required or desired thickness.

One aspect of our approach involves plating pillars of electrically conductive material up from a seed layer located on a substrate, surrounding the pillars with a fill material so that the pillars and fill material collectively define a first package, and removing the substrate from the first package.

Another aspect of our approach involves a process for forming a package. The process involves applying a photoresist onto a seed layer-bearing substrate, defining openings in the photoresist at locations where interconnects are to be located, the openings extending down to and exposing the seed layer at the locations, plating the exposed seed layer until a desired height of plating metal has been built up, removing the photoresist while leaving the built up plating metal in place, applying a fill material into a volume created by the removal of the photoresist, and removing the substrate.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

In general overview, our approach builds up a series of interconnects on a wafer or other suitable substrate using photolithographic and plating techniques. Thus, we can form small interconnects, on extremely tight pitches, because the ability to do so is only limited by the ability to photolithographically define the interconnects and the ability to plate them to their desired height. Moreover, packages formed using an approach herein can have a broad range of thicknesses extending from as thin as about 10 μm to even 1000 μm or more (note that, the measurements referred to throughout this description are not intended to be exact but rather, should be considered to be plus or minus the tolerances in measurement or manufacture acceptable for the particular application).

FIG. 1 through FIG. 8 collectively illustrate, in simplified form, a basic version of the instant approach to formation of a plated pillar package.

Figure 1:
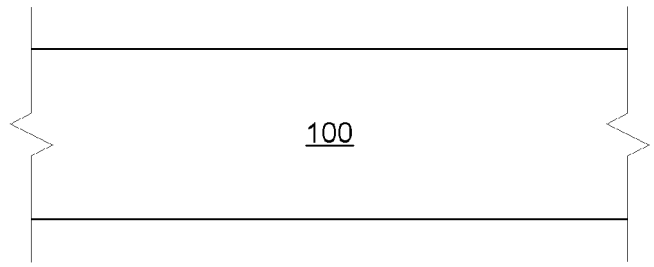
FIG. 1 illustrates, in simplified form, a portion of a substrate 100 that will serve as the base for the process described herein.

FIG. 1 illustrates, in simplified form, a portion of a substrate 100 that will serve as the base for the process described herein. Depending upon the particular implementation, the substrate 100 can be a semiconductor wafer, a wafer of ceramic, or some other material of having the characteristics that it can withstand the operations involved in the process and, ultimately, can be removed without damaging the formed package.

Ideally, because of the potential narrow pitches involved between the interconnects, the substrate 100 will be very flat (e.g. if a standard 8" wafer, it should have an overall bow or dish of no more than, and preferably much less than, 10 μm).

The process begins by metalizing the substrate 100 to apply a thin layer of metal onto the substrate 100 and thereby form a seed layer for a subsequent plating operation (electroless or electro-plating). The metalization can be done through, for example, a vapor deposition process (chemical or physical) or any other suitable process. In some variants, the substrate itself could be a metal or metal alloy. In such cases, if the substrate itself can serve as the seed layer, the metalizing step would be optional or unnecessary.

Depending upon the particular implementation, and advantageously as described below, the metalizing operation can be performed across the entire substrate, limited to particular areas (for example, an area suitably sized relative to the area of a chip to which the package will ultimately be attached), or even more limited to the vicinity of defined connection points.

Figure 2:
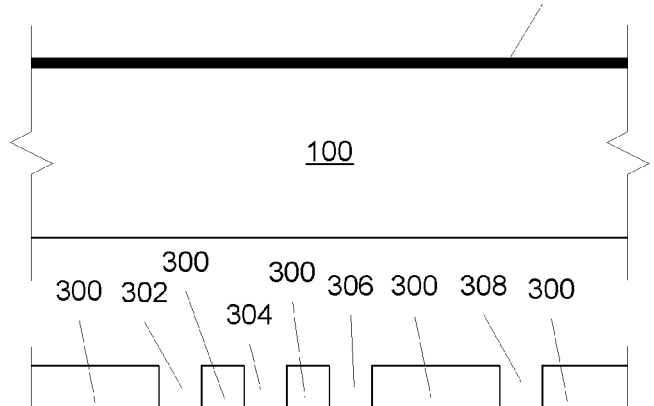
FIG. 2 illustrates, in simplified form, the portion of the substrate 100 after a seed layer has been deposited by metalizing.

FIG. 2 illustrates, in simplified form, the portion of the substrate 100 after a seed layer 200 has been deposited by metalizing.

Figure 3:
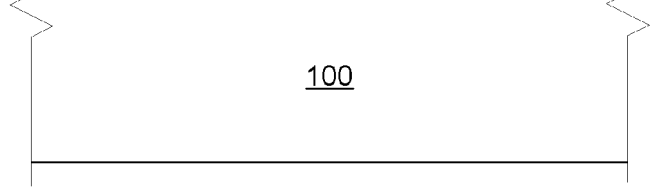
FIG. 3 illustrates, in simplified form, the portion of the substrate of FIG. 2 in which a photoresist has been applied and patterned to create openings down to the seed layer.

FIG. 3 illustrates, in simplified form, the portion of the substrate 100 of FIG. 2 in which a photoresist 300 has been applied and patterned to create openings 302, 304, 306, 308 extending down to, and exposing, parts of the seed layer 200.

Depending upon the particular implementation, the photoresist 300 can be flowable or solid. Conventional flowable photoresists used in semiconductor processing are suitable for use with the process. Suitable solid photoresist include those from the Riston® dry film photoresist line, specifically, the Riston® PlateMaster, EtchMaster and TentMaster lines of photoresist, all commercially available from E. I. du Pont de Nemours & Co.

As shown in FIG. 3, for purposes of example, the openings all fall within about a 140 μm long cross section of the substrate 100, with the three leftmost openings being about 10 μm wide and on a 20 μm pitch. Of course, with particular implementations, the openings can be any desired size, but the approach will be most advantageous for high density interconnects where the openings are 50 μm wide or less, in some cases, less than 10 μm wide. and the openings are on a pitch of 50 μm or less, in some cases again, less than 10 μm.

Next, the substrate is inserted into a plating bath so that a plating metal 400 will build up on the parts of the seed layer 200 that were exposed through the patterned photoresist 300. This can occur via, for example, a conventional electro- or electroless plating process. Depending upon the particular application, the plating metal 400 can be allowed to build up to any height within the openings as desired.

Figure 4:
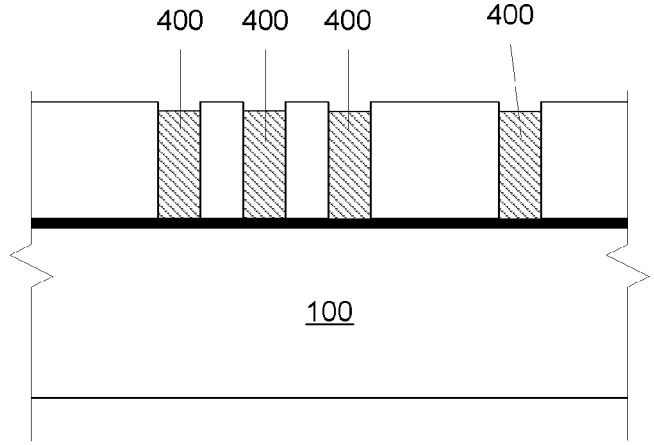
FIG. 4 illustrates, in simplified form, the portion of the substrate after plating is complete.

FIG. 4 illustrates, in simplified form, the portion of the substrate 100 after plating is complete.

Once plating is complete, the photoresist 300 is removed as required for the particular photoresist 300 used.

Figure 5:
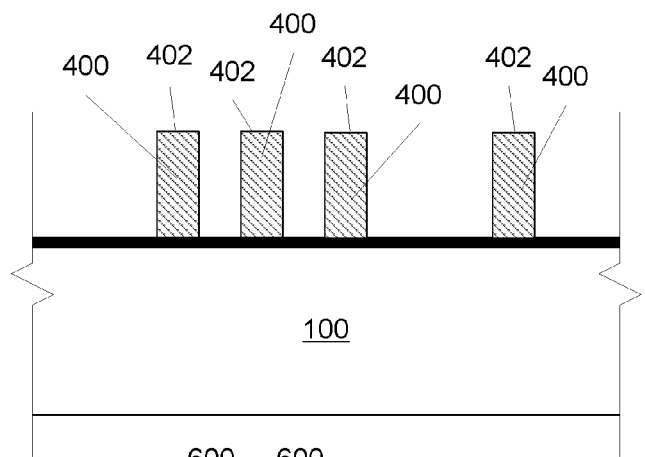
FIG. 5 illustrates, in simplified form, the portion of the substrate after removal of the photoresist.

FIG. 5 illustrates, in simplified form, the portion of the substrate 100 after removal of the photoresist 300. As shown, the plating metal 400 left behind after removal of the photoresist 300 results in a series of upstanding "pillars" of the plating metal 400 that have essentially coplanar upper surfaces 402 and are anchored at their bottoms to the seed layer 200. These pillars will form the interconnects of the ultimate package.

At this point, a package material 600 is applied to the substrate 100 to fill in the volume previously occupied by the photoresist 300 up to about the level of the upper surfaces 402. Ideally, the package material 600, when solidified, should be electrically non-conducting and relatively stable and/or inert. The package material 600 is then allowed to solidify by hardening or curing as appropriate.

Depending upon the particular implementation, this package material 600 can be a self hardening, curable or other material. Suitable examples of the package material 600 include moldable and flowable resins and plastics, such as for example, epoxies or liquid crystal polymers.

Figure 6:
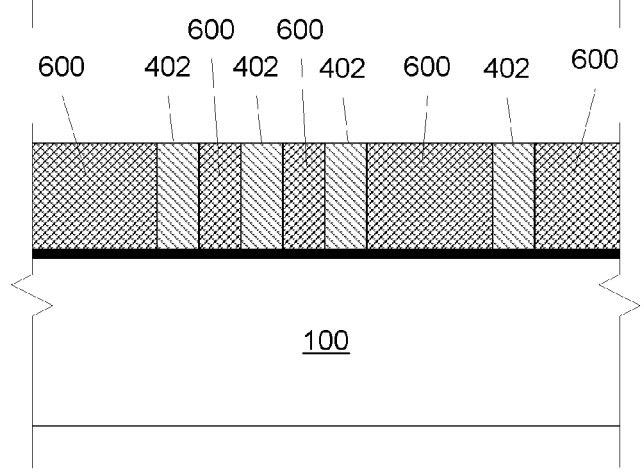
FIG. 6 illustrates, in simplified form, the portion of the substrate after the package material is fully hardened.

FIG. 6 illustrates, in simplified form, the portion of the substrate 100 after the package material 600 is fully hardened.

Finally, in the basic process, the substrate 100 and seed layer 200 are removed using a mechanical, chemical or chemical-mechanical process appropriate for the particular materials involved, leaving behind the fully formed package 700.

Figure 7:
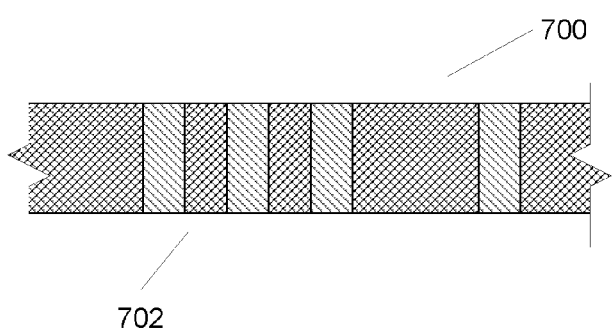
FIG. 7 illustrates, in simplified form, the package after removal of the substrate and seed layer.

FIG. 7 illustrates, in simplified form, the package 700 after removal of the substrate 100 and seed layer 200 from the underside 702 of the package 700.

Figure 8:
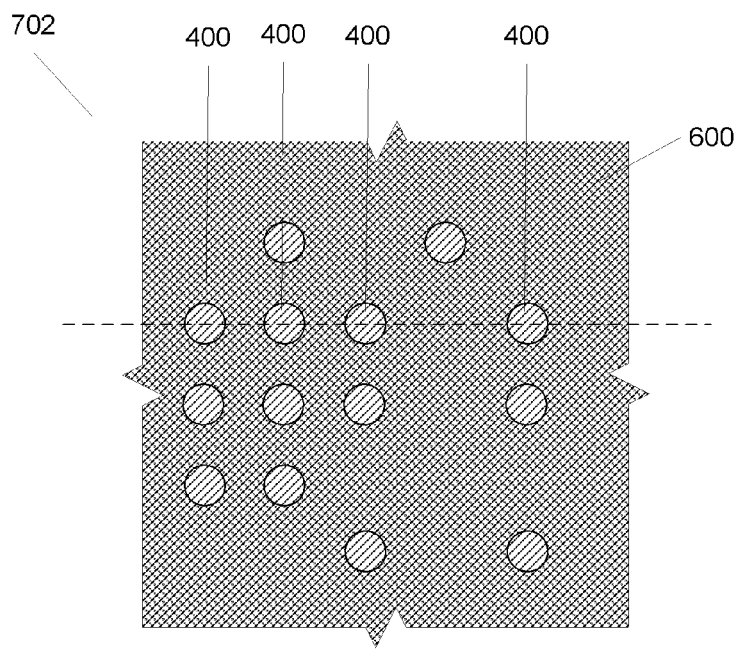
FIG. 8 illustrates, in simplified form, the underside of a portion of the package containing the cross section of FIG. 7.

FIG. 8 illustrates, in simplified form, the underside 702 of a portion of the package 700 containing the cross section of FIG. 7, the cross section having been taken through the location indicated by the dashed line. As can now be seen, this approach allows for formation of densely packed interconnects. For example, in the left side of FIG. 8, there are eight interconnects 400 located within a square area that is about 50 μm on a side.

FIG. 9 through FIG. 16 collectively illustrate, in simplified form, a more sophisticated variant of the instant approach to formation of a plated pillar package. The approach is similar to that of FIG. 1 through FIG. 8, except for the metalization details. Thus, this variant will be described in abbreviated form with the understanding that, except as specifically noted, the details are the same as described in connection with FIG. 1 through FIG. 8.

Figure 9:
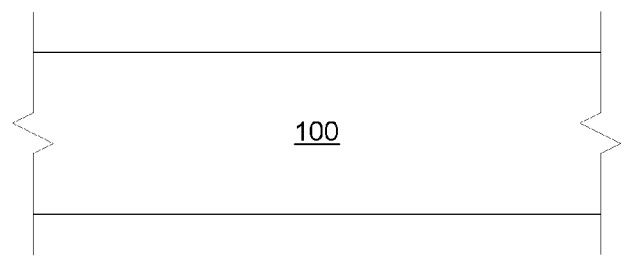
FIG. 9 through FIG. 16 collectively illustrate, in simplified form, a more sophisticated variant of the instant approach to formation of a plated pillar package.

Thus, as shown in FIG. 9, the process begins with a substrate 100.

Figure 10:
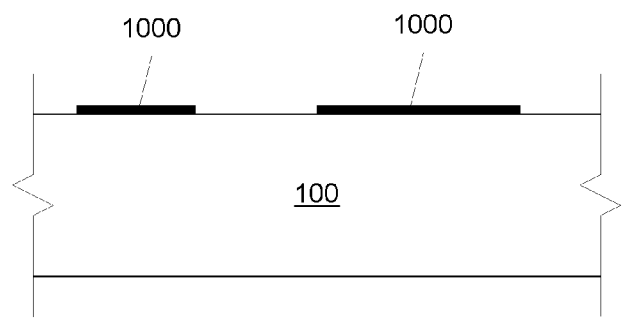

Next, the process of metalizing the substrate 100 to form a seed layer 1000 for the subsequent plating operation occurs. However, unlike the approach of FIG. 1 through FIG. 8, the seed layer 1000 is applied after an intermediate patterning and lift-off has been performed to ensure that the seed layer 1000 is only located in areas where traces or contact points in the final package will be located. In addition, the seed layer 1000 is applied to be of sufficient thickness to allow the connection to ultimately carry the necessary current. FIG. 10 illustrates, in simplified form, the substrate 100 after the localized seed layer 1000 has been applied. Other metal or conductive material can connect the seed layers to allow current to flow to them if electroplating is subsequently used, however, the thickness of these connection regions need not be thick enough to carry the operating current of the final chips that are attached to the package.

Figure 11:
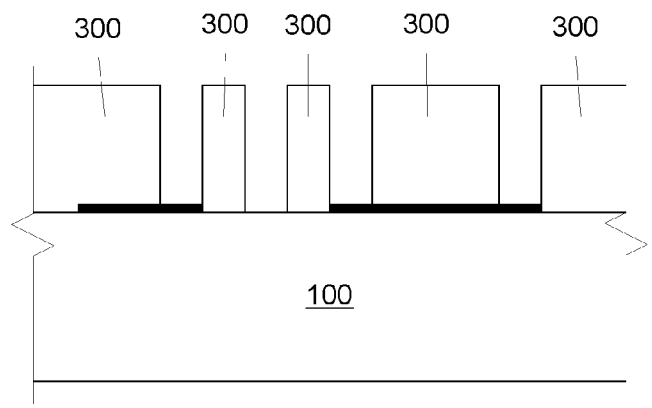
Figure 12:
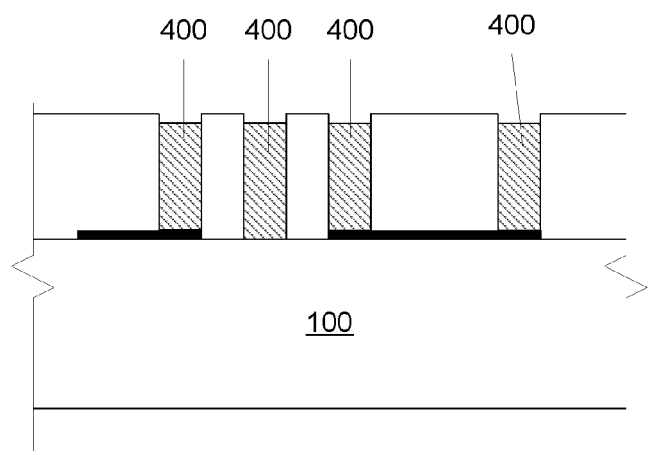
Figure 13:
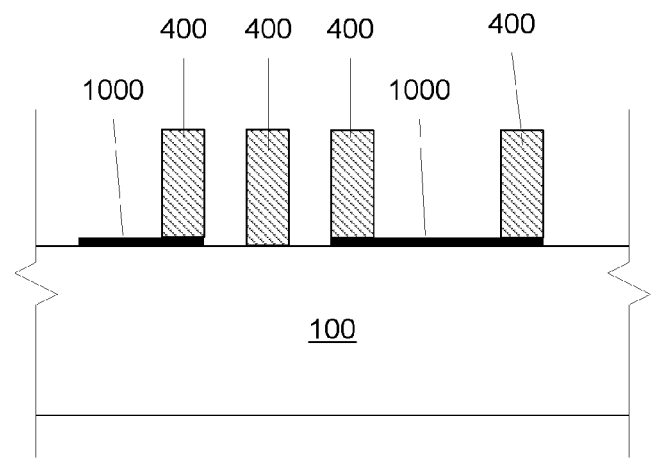
Figure 14:
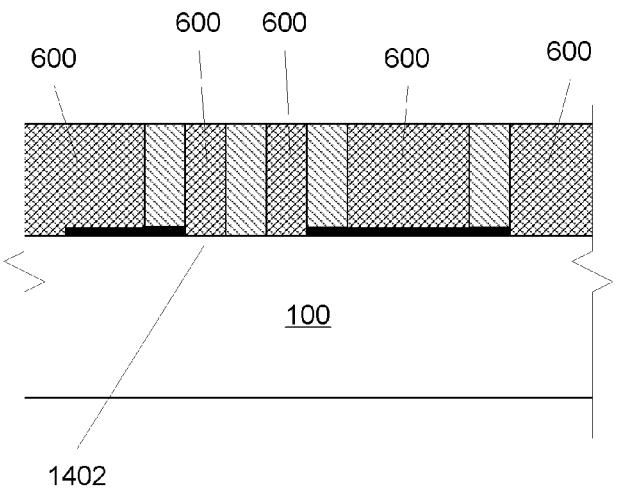

Thereafter, as shown in FIG. 11 through FIG. 14, the approach is the same as described above. Specifically, a photoresist 300 is applied and patterned to expose the relevant portion of the seed layer 1000 (FIG. 11). Then, the plating occurs to build up the plating metal 400 (FIG. 12). Next, the photoresist 300 is removed, leaving behind the pillars of plating metal 400. (FIG. 13).

At this point it is worth noting that, in an alternative variant of this approach, immediately following the deposition of the seed layer 1000, but before removal of the photoresist used to localized the locations for seed layer placement, the substrate can undergo a preliminary plating operation. In other words, immediately prior to what is shown in FIG. 10. The purpose of this plating operation is to build up the seed to a thickness appropriate for handling the current that could be carried by the contact or trace in the ultimate package. In such a variant, the approach would otherwise be the same, except that the seed layer of FIG. 10 would already have a layer of plating metal over its extent and thus be thicker.

Next, the package material 600 is applied and solidified (FIG. 14), followed by removal of the substrate 100 (FIG. 15) from the underside 1402, and any connections between the seed portions (if a metal or other conductor were used as described above) leaving behind the fully formed package 1500.

Figure 15:
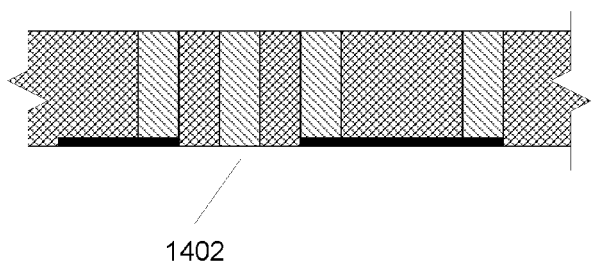
Figure 16:
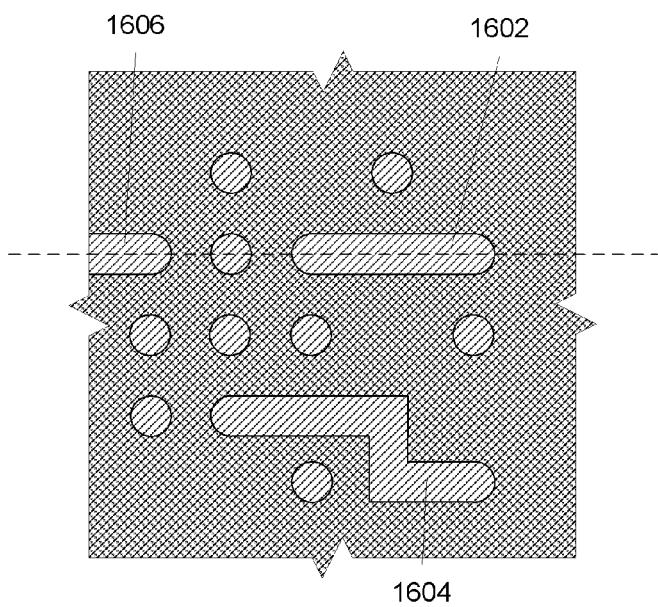

FIG. 16 illustrates, in simplified form, the underside 1402 of a portion of the package 1500 containing the cross section of FIG. 15, the cross section having been taken through the location indicated by the dashed line. As can now be seen, in addition to allowing for formation of densely packed interconnects, this approach further allows for the package to contain connections 1602, 1604 between the interconnects or routing traces 1606, that can be connected to from external to the package 1500, for example, from another chip or another package.

Having described two basic variants, it will be appreciated that once such packages 700, 1500 are created, they can be treated as chips and thus, in addition to acting as a package for one or more chips, they can be stacked on and joined to each other or sandwiched between chips to allow for the formation of complex interconnects rivaling those created when back-end processing of a wafer to interconnect devices occurs.

Still further, with some variants, more complex interconnect arrangements can be created by simply using the final basic package in place of the substrate 100 and using the localized seed placement variant to apply a localized seed layer to a surface of the completed package. Then, the process described herein can be performed as described up to the point where the package material 600 is applied and solidified, at which point, the more complex package will be complete (i.e. there is no substrate to remove.

Figure 17:
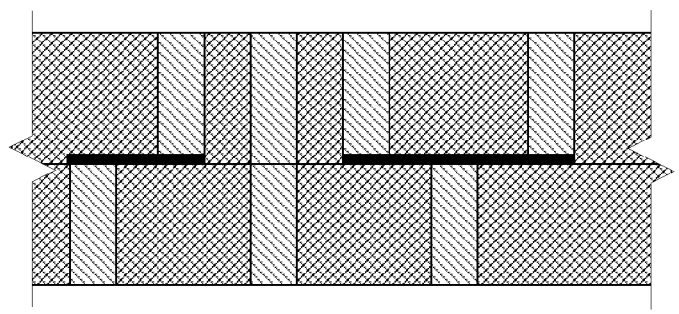
FIG. 17 illustrates, in simplified form, a package variant created by using the variant of FIG. 10 through FIG. 15 as a substrate for the basic approach of FIG. 2 through FIG. 7.

FIG. 17 illustrates, in simplified form, a package 1700 variant created by using the variant of FIG. 10 through FIG. 15, and then using it as a substrate for the basic approach of FIG. 2 through FIG. 7.

Figure 18:
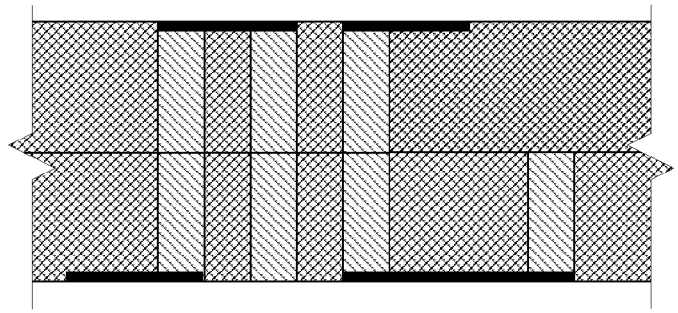
FIG. 18 illustrates, in simplified form, a package variant created by using the variant of FIG. 10 through FIG. 15, to create a first package and then using that package as the substrate in the same variant approach.

FIG. 18 illustrates, in simplified form, a package 1800 variant created by using the variant of FIG. 10 through FIG. 15, to create a first package and then using that package as the substrate in the same variant approach.

Finally, it should now be understood that plated packages created as described herein can, in some cases, be ideally suited for use with the different intelligent chip packages, or as the back end wafers, described in the above-incorporated applications.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of forming a package, the method comprising:
   providing a first sacrificial layer on a substrate, wherein the substrate includes a first seed layer provided thereon;
   forming openings in the first sacrificial layer to expose portions of the first seed layer;
   plating the exposed portions of the first seed layer with a conductive metal to form pillars;
   removing the first sacrificial layer;
   providing a first fill material on the substrate adjacent the pillars, wherein an outer surface of the first fill material is planar to an upper surface of the pillars; and
   removing the substrate.

2. The method of claim 1, further comprising forming the first seed layer on the substrate before the first sacrificial layer is formed.

3. The method of claim 2, wherein said forming the first seed layer comprises forming contacts and traces.

4. The method of claim 3, wherein said forming contacts and traces comprises metalizing the contacts and the traces.

5. The method of claim 4, wherein the first sacrificial layer is a photoresist.

6. The method of claim 5, wherein the first fill material is an insulator.

7. The method of claim 1, wherein said plating comprises electroplating or electroless-plating.

8. The method of claim 1, wherein at least some of the openings have a width of 50 µm or less.

9. The method of claim 8, wherein at least some of the openings have a pitch of 50 µm or less.

10. The method of claim 1, wherein at least some of the openings have a width of 20 µm or less.

11. The method of claim 10, wherein at least some of the openings have a pitch of 20 µm or less.

12. The method of claim 1, wherein a first set of the openings have a first width and a second set of the openings have a second width that differs from the first width.

13. The method of claim 1, further comprising:
   providing a second seed layer over the pillars and the first fill material;
   providing a second sacrificial layer over the second seed layer, the pillars, and the first fill material;
   forming openings in the second sacrificial layer;
   forming pillars in the openings of the second sacrificial layer;
   removing the second sacrificial layer; and
   providing a second fill material over the second seed layer and the first fill material.

14. The method of claim 1, wherein the first fill material comprises a curable or self-hardening material.

15. A method of forming a package, the method comprising:
   metalizing at least a portion of a surface of a substrate to form a seed layer;
   providing a photoresist over the seed layer and the substrate;
   forming openings in the photoresist to expose portions of the seed layer;
   plating the exposed portions of the seed layer with a conductive metal to form interconnects;
   after said plating, removing the photoresist;
   providing a fill material on the substrate adjacent the interconnects after removing the photoresist, wherein an outer surface of the fill material forms a substantially planar surface with an outer surface of the interconnects; and
   removing the substrate.

16. The method of claim 15, wherein said metalizing comprises a vapor deposition process.

17. The method of claim 15, wherein said metalizing comprises forming contacts and traces.

18. The method of claim 17, wherein said forming contacts and traces comprises metalizing the contacts and the traces.

19. The method of claim 15, wherein the fill material is an insulator.

20. The method of claim 15, wherein said plating comprises electroplating or electroless-plating.

21. The method of claim 15, wherein at least some of the openings have a width of 50 μm or less and a pitch of 50 μm or less.

22. The method of claim 15, wherein at least some of the openings have a width of 20 μm or less and a pitch of 20 μm or less.

23. The method of claim 15, wherein a first set of the openings have a first width and a second set of the openings have a second width that differs from the first width.

24. The method of claim 15, wherein the fill material comprises a curable or self-hardening material.

* * * * *